(12) United States Patent
Wolf

(10) Patent No.: US 10,079,528 B2
(45) Date of Patent: Sep. 18, 2018

(54) POWER CONVERTER

(71) Applicant: GRUNDFOS HOLDING A/S, Bjerringbro (DK)

(72) Inventor: Christian Wolf, Bjerringbro (DK)

(73) Assignee: GRUNDFOS HOLDING A/S, Bjerringbro (DK)

( * ) Notice: Subject to any disclaimer, the term of this patent is extended or adjusted under 35 U.S.C. 154(b) by 50 days.

(21) Appl. No.: 15/116,690

(22) PCT Filed: Jan. 23, 2015

(86) PCT No.: PCT/EP2015/051368
§ 371 (c)(1),
(2) Date: Aug. 4, 2016

(87) PCT Pub. No.: WO2015/117843
PCT Pub. Date: Aug. 13, 2015

(65) Prior Publication Data
US 2016/0352187 A1 Dec. 1, 2016

(30) Foreign Application Priority Data
Feb. 5, 2014 (EP) .................................... 14153916

(51) Int. Cl.
*H02K 11/01* (2016.01)
*H02M 7/00* (2006.01)
*H05K 9/00* (2006.01)
*H02K 11/33* (2016.01)
*H02K 5/24* (2006.01)
(Continued)

(52) U.S. Cl.
CPC .............. *H02K 11/01* (2016.01); *H02K 5/24* (2013.01); *H02K 11/33* (2016.01); *H02M 5/297* (2013.01); *H02M 7/003* (2013.01);
*H02P 27/06* (2013.01); *H05K 9/0026* (2013.01); *H05K 9/0037* (2013.01)

(58) Field of Classification Search
CPC ....................................................... H02K 11/01
USPC .................................................. 318/503, 34
See application file for complete search history.

(56) References Cited

U.S. PATENT DOCUMENTS 7,126,294 B2 * 10/2006 Minami .................... G05F 1/67
318/139
8,476,524 B2 * 7/2013 Sella .................. G08B 13/1409
174/50

(Continued)

FOREIGN PATENT DOCUMENTS

DE 297 22 918 U1 3/1998
DE 20 2005 014 044 U1 11/2005
(Continued)

OTHER PUBLICATIONS

Kiel, Antriebslösungen, Mechatronik für Produktion und Logistik, pp. 196-197, 164-165, 198-199 458-459.
(Continued)

*Primary Examiner* — David S Luo
(74) *Attorney, Agent, or Firm* — McGlew and Tuttle, P.C.

(57) ABSTRACT

A frequency converter includes an enclosure, in which electrical and electronic components (5, 6, 7, 22) are arranged and which at least partly is designed as a Faraday cage. At least two Faraday cages (4, 9, 15, 29) are provided within the enclosure, in order to improve the electromagnetic compatibility (EMC).

19 Claims, 4 Drawing Sheets

(51) Int. Cl.
*H02M 5/297* (2006.01)
*H02P 27/06* (2006.01)

(56) References Cited

U.S. PATENT DOCUMENTS

| | | | |
|---|---|---|---|
| 9,129,792 B2* | 9/2015 | Goscha | H01J 65/048 |
| 9,438,035 B2* | 9/2016 | Capp | H02J 7/35 |
| 2004/0172502 A1 | 9/2004 | Lionetta et al. | |
| 2005/0259403 A1 | 11/2005 | Sonoda | |
| 2011/0285225 A1 | 11/2011 | Matsuda et al. | |
| 2012/0071041 A1 | 3/2012 | Dolhagaray et al. | |
| 2016/0100510 A1 | 4/2016 | Nassler et al. | |

FOREIGN PATENT DOCUMENTS

| | | |
|---|---|---|
| DE | 102013207673 A1 | 10/2014 |
| EP | 0 267 129 A1 | 5/1988 |
| EP | 0 356 991 A2 | 3/1990 |
| EP | 0 794 606 A1 | 9/1997 |
| EP | 2 149 973 A2 | 2/2010 |
| EP | 2 151 835 A2 | 2/2010 |
| FR | 2943210 A1 | 9/2010 |
| GB | 2420911 A | 6/2006 |
| JP | 2006230064 A | 8/2006 |
| WO | 92/16094 A1 | 9/1992 |
| WO | 93/20677 A1 | 10/1993 |

OTHER PUBLICATIONS

Rodewald, Elektromagnetische Verträglichkeit.
Acim Jouanin, "Fils et cables electrique", pp. 1-8, XP055440269, found on the Internet: URL: http://www.acim-jouanin.fr/francais/contenu/catalogue/Cables/FILS_CABLES_ET_GAINES.pdf. [found on Jan. 12, 2018].

* cited by examiner

POWER CONVERTER

CROSS REFERENCE TO RELATED APPLICATIONS

This application is a United States National Phase Application of International Application PCT/EP2015/051368 filed Jan. 23, 2015 and claims the benefit of priority under 35 U.S.C. § 119 of European Patent Application 14153916.3 filed Feb. 5, 2014, the entire contents of which are incorporated herein by reference.

FIELD OF THE INVENTION

The invention relates to a power converter, in particular to a frequency converter, with an enclosure, in which electrical and electronic components are arranged and which is at least partly constructed as a Faraday cage.

BACKGROUND OF THE INVENTION

Power converters are used nowadays in many technical applications. Thus, for example, with centrifugal pumps which are applied as heating circulation pumps or likewise, it is nowadays counted as belonging to the state of the art, to provide these with a frequency converter which is arranged in a terminal box or frequency converter housing which are mostly attached on the motor housing. Such frequency converters have a multitude of electronic components, from which electromagnetic and/or electrostatic radiation is emitted as an interference source, and these must be shielded, in order to ensure the electromagnetic compatibility (EMC). On the other hand, such frequency converters also comprise sensitive electronic components (susceptible components), in particular of the control and regulation electronics, which are to be protected from electromagnetic and/or electronic influences.

For this, the encasing of the electrical and electronic components forming the power converter with a Faraday cage is counted as belonging to the state of the art.

From DE 297 22 918 U1 it is counted as belonging to the state of the art, to design the complete power converter housing as a Faraday cage.

It can be difficult to ensure the electromagnetic compatibility of the power converter despite such a complete shielding of the power converter by way of a Faraday cage. In practice, this is realized additionally by way of the switching times, especially rise and fall times when switching of the electronics switches being adapted, in order to obtain a lower interfering radiation in particular in the region of higher frequencies. This however has the disadvantage that the efficiency of the converter is decreased, thus losses will increase.

It is also counted as belonging to the state of the art, to arrange interference suppression ferrites beads mounted on the input cable.

SUMMARY OF THE INVENTION

Against this background, it is an object of the invention to reduce the above-mentioned disadvantages, thus to improve the electromagnetic compatibility of a power converter, in particular of a frequency converter, where possible without compromising the performance and without a high design effort.

According to the invention a power converter is provided, in particular a frequency converter, that comprises an enclosure, in which electrical and electronic components are arranged and which at least partly is designed as a Faraday cage. According to the invention, the enclosure comprises at least two Faraday cages.

The basic concept of the solution according to the invention is to provide at least two Faraday cages, in order in this manner to achieve an improved electromagnetic separation of components or subassemblies within the frequency converter and thus to improve the EMC.

The shielding of power converters, in particular of frequency converters, is complex, since a combination of capacitive, magnetic and electromagnetic fields is to be shielded. It is important when shielding magnetic fields, that the Faraday cage forms a closed, conductive surface, so that induced currents can be short-circuited by it. For shielding capacitive or magnetic fields, the Faraday cage is to be designed such that an opening in the Faraday cage is always smaller than a third of the smallest distance of an electrical component to the cage. For electromagnetic shielding, it is necessary for the openings in the Faraday cage to be significantly smaller than the wavelength of the electromagnetic field to be shielded, typically a thirtieth of the wavelength. In practice, the Faraday cage for shielding should have holes, openings recesses or likewise, whose clear width or whose diameter is smaller than 3.3 mm, since frequencies of up to 30 gigahertz occur in the power converter. Thereby, the distance of electrical/electronic components to the Faraday cage should be more than 10 mm.

Thereby, it is particularly advantageous if according to a further development of the invention, two separate Faraday cages have a common cage wall. Such a design is highly effective and is also inexpensive due to the common use of a cage wall. A conductor feed-through through such a wall is advantageously effected by way of a feed-through capacitor.

A particularly advantageous design of the invention results due to the fact that one or more components which in operation form an electromagnetic and/or electrostatic interference source are arranged in at least one Faraday cage, and one or more components which are sensitive with regard to the receiving of electromagnetic and/or electrostatic interference signals (susceptible components) are arranged in at least one other Faraday cage. This further development according to the invention is particularly effective, since on the one hand a shielding of the components producing interference signals is effected and on the other hand a shielding for the components which are particularly susceptible to interference signals is formed, by way of the at least two Faraday cages. By way of this, the high-frequency inference which arises within the power converter can be very considerably reduced, in particular if one considers the interference radiation exiting from the power converter as a whole and there is no need for reduced switching times.

Thereby, it is particularly advantageous if at least the electronic switches of the power circuit of the power converter; preferably the complete power circuit are arranged in an individual Faraday cage. The power circuit of the power converter typically represents a comparatively large interference source, which advantageously is shielded separately within the power converter by a Faraday cage.

Additionally or alternatively, it is particularly advantageous if at least one or a number of input or output interference suppression filters are arranged in Faraday cages which are separated from one another. An interference radiation out of the power converter can be effectively prevented by way of this.

According to a further development of the invention, a feed-through capacitor is provided in a wall between two Faraday cages, in order to prevent inference signals being transmitted between the Faraday cages within the power converter at the wire holes. Thereby, one or more such feed-through capacitors can be provided in a wall, depending on the number of conductors to be led through. Thereby, it can be the case of conductors for leading electrical signals and/or for transmitting electrical power, from one cage into the other cage.

According to a further development of the invention, at least one capacitor at one side is electrically connected to the wall of the Faraday cage and at the other side is electrically connected to the conductor which runs through the hole opening (feed-through opening) from one Faraday cage to the other, in order to achieve an as efficient as possible interference radiation reduction. Thereby, the closer this capacitor is electrically connected with its wall side to the feed-through opening, the better is the effect.

Such a capacitor which short-circuits high frequencies to the Faraday cage, is advantageously provided in the Faraday cage, in which an interference signal arises, or if this comes from the outside, through which such an interference signal is led.

According to an advantageous further development of the invention, a separate Faraday cage is provided, which forms an output filter cage of the power converter which comprises two or more power-leading conductors to a motor and to at least one capacitor which is connected between a conductor and the wall of the output filter cage. This design is particularly advantageous for embodiments, with which the leads leading to the motor have to be led out of a Faraday cage.

In an arrangement which is simple with regard to design, but highly effective with regard to the EMC, only the input interference suppression filter is arranged in another Faraday cage apart from the conductors leading electrical power. By way of this, one can effectively prevent electrostatic and/or electromagnetic interference being radiated into the input interference suppression filter from the power part.

According to an alternative advantageous formation of the invention, it can be advantageous to arrange the stator of the motor, the power-leading conductors between the power converter and the electrical motor, and the power circuit of the power converter, in a common Faraday cage. Such a common Faraday cage can advantageously be formed by the metallic motor housing or alternatively a suitable shielding of the motor, by a cable-shielding of the lead between the motor and the power converter as well as by a Faraday cage which forms the power converter enclosure or a part thereof.

Usefully, but not necessarily, the Faraday cages of the power converter and, as the case may be, also of the motor are electrically connected to one another and preferably connected to the earth potential. It is particularly advantageous if the power converter enclosure comprises three Faraday cages, and specifically one in which at least the power part of the power converter is arranged, another for the input interference suppression filter and a further one, in which the interface circuit of the power converter is arranged. The EMC of power converter designed in such a manner can be further improved by way of this arrangement.

If, as is often the case with the circuiting of electronic components, a circuit board with electronic components which are connected by strip conductors on the upper side of the circuit board and are arranged on this circuit board, is provided in the power converter, according to a further development of the invention, at least some electronic components are enclosed by at least one Faraday cage, wherein a conductive layer of the circuit board forms a wall of the Faraday cage. If therefore the components are connected to one another by way of strip conductors on the upper side, then this conductive layer is typically a layer located therebelow or however a layer on the lower side of the circuit board.

If, as is advantageous, the electronic components are arranged in regions of the circuit board which are separated from one another, advantageously, one or more of these separated regions are enclosed by one or also more Faraday cages, wherein a conductive surface of the circuit board forms a wall of the Faraday cages. Thus, several Faraday cages can be arranged next to one another on the one side of the circuit board, wherein advantageously adjacent Faraday cages each comprise a common wall, and the lower wall of the cages is formed by a conductive surface of the circuit board, for example an intermediate layer or a conductive layer on the lower side.

Alternatively or additionally, electronic components can be arranged on the upper side and the lower side of the circuit board, wherein Faraday cages can extend to both sides of the circuit board, and a conductive layer within the circuit board forms a wall of the Faraday cages on both sides. The circuit board is then a multi-layer board.

Thus, according to the invention, Faraday cages can be arranged on a circuit board side next to one another and/or individually or next to one another on both circuit board sides. According to a further development of the invention, a Faraday cage can also extend to both sides of a circuit board, and the circuit board is then advantageously furnished with electronic components on both sides and connected by way of wire holes which pass through the circuit board. Then the Faraday cage extends through the circuits board itself.

Particularly advantageously, the design of the power converter according to the invention is applied for a frequency converter of an electrical drive motor of a centrifugal pump, whose enclosure is arranged at or on the motor enclosure and/or pump enclosure, so that the Faraday cages which are formed in the enclosure of the frequency converter, as the case may be, can be electrically conductively connected to the motor housing and/or to the pump housing in a simple manner. Advantageously, an asynchronous motor or a permanent magnet motor serves as a drive motor.

The Faraday cage is advantageously designed closed in a manner such that openings, recesses or free spaces are formed in such a smaller manner, that their clear width or their largest diameter is smaller than 3.3 mm, in order to ensure an adequate shielding from magnetic, electromagnetic and capacitive fields. Moreover, it is advantageous if electrical/electronic components within the Faraday cage, with the exception of the regions, in which leads are led through, have a distance of at least 10 mm to the cage wall. This minimum distance of course must be undercut in the region of lead feed-throughs. The measures described further above, for example the arrangement of feed-through capacitors are necessary in this region, in order to effectively prevent an entry or exit of interfering radiation out of the Faraday cage.

The invention is hereinafter explained in more detail by way of embodiment examples represented in the drawing.

The present invention is described in detail below with reference to the attached figures. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
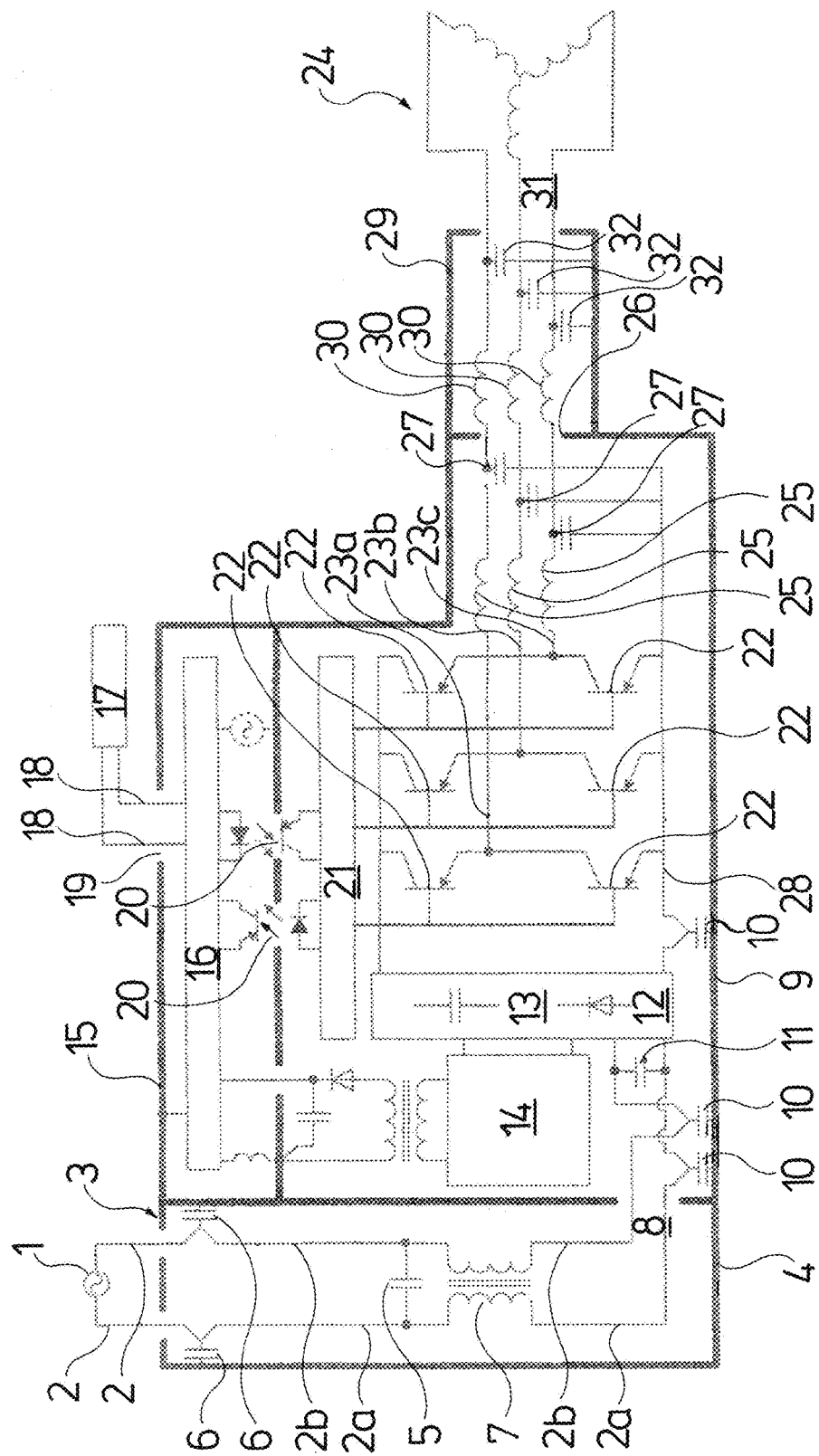
FIG. 1 is a circuit diagram of a frequency converter equipped with an input filter according to the invention, with a connected motor, where the motor is connected with the inverter via a cable.

Referring to the drawings, the frequency converter represented in FIG. 1 is provided for connection current mains 1. The 1 phase version is shown here for simplicity but naturally by adding the necessary wires the same principle can be applied to a multi-phase supply. The supply lead 2 which is to be connected to the alternating current mains 1 is firstly led through an input interference suppression filter 3 which is arranged in a first Faraday cage 4 or is shielded by this. The two conductors 2a and 2b within the input interference suppression filter 3 are connected to one another by way of a capacitor 5, with which it can be the case of an X2 capacitor. The conductors 2a and 2b of the supply lead 2 moreover within the first Faraday cage 4 are conductively connected to the Faraday cage 4 in each case via a capacitor 6.

Finally, the conductors 2a and 2b, after they have passed the capacitor 5 for the purpose of the short circuit of the high frequencies, are led to a common mode choke (CMC), and specifically the conductor 2a to the one side of the choke and the conductor 2b to the other side of the choke 7, before they are led through an opening 8 in the wall of the first Faraday cage 4 into a second Faraday cage 9. The conductors 2a and 2b close to the opening 8 are in each case conductively connected via a capacitor 10 to the second Faraday cage 9, and with regard to the capacitors it is the case of Y2 capacitors. Moreover, the conductors 2a and 2b are connected at the input side of the second Faraday cage 9 by a capacitor 11 which is likewise an X2 capacitor as the capacitor 5.

The supply lead 2 is hereinafter led to a rectifier circuit 12, whose output feeds an intermediate circuit 13 in a manner known per se, as well as moreover a switch mode power supply 14 which is provided for voltage supply of a measurement circuit 16 arranged in a third Faraday cage 15. The interface circuit 16 comprises a sensor 17 which is arranged outside the third Faraday cage 15 and which is connected via a lead 18, through an opening 19 to the interface circuit 16 within the third Faraday cage 15. The signals of the measurement circuit 16 are transmitted in a wireless manner by way of opt-couplers 20 integrated in the wall between the third and the second Faraday cage and where they are then received by a microcontroller 21 arranged within the second Faraday cage 9 and controlling six power switches 22, which in each case in a paired manner are assigned to the conductors 23a, 23b and 23c which form the supply leads for the three phases of the electrical motor 24 which is connected thereto. The interface circuit is used to interface to one or more sensors and to interface to one or more data communication cables or wireless data connection. The communication between the interface circuit 13 and the inverter microcontroller 21 is galvanic isolated with for instance opto-couplers 20 or transformers. The galvanic isolation is ideally placed in a hole between the 2 cages. The power supply for the interface circuit 16 must also be decoupled with a capacitor to the faraday cage close to the hole where the power supply wire is feed through the wall.

The conductors 23a, 23b and 23c are in each case led through a choke 25 and directly before the leading-out of the conductors, through an opening 26 in the second Faraday cage 9, are connected via capacitors 27 to a lead 28 which in turn is conductively connected via a capacitor 10 to the second Faraday cage 9. The capacitors 27 are X2 capacitors.

The conductors 23 in the second Faraday cage 9 which receives the input circuit, the intermediate circuit and the power circuit of the frequency converter, are led via an opening 26 into a fourth Faraday cage 29 which forms an output filter cage, in which each of the conductors 23a, 23b and 23c firstly run through a choke 30 and directly before its output via an opening 31 is connected to a capacitor 32, whose other side is conductively connected to the fourth Faraday cage 29. The capacitors 32 are Y2 capacitors.

The Faraday cages 4, 9, 15 and 29 are conductively connected to one another and connected to the earth potential. As the illustratory picture according to FIG. 1 clarifies, they partly have common walls and are formed by a metallic skin or by way of very fine-meshed net, e.g. copper gauze. They can form part of the frequency converter housing as well as one or more circuit boards, on which the components are arranged and connected or circuited.

FIG. 1 shows an embodiment, with which the frequency converter consists of a unit which is constructed from several Faraday cages and whose input is characterized by the supply lead 2 and whose output is characterized by the conductors 23a, 23b and 23c which supply the motor 24.

Figure 2:
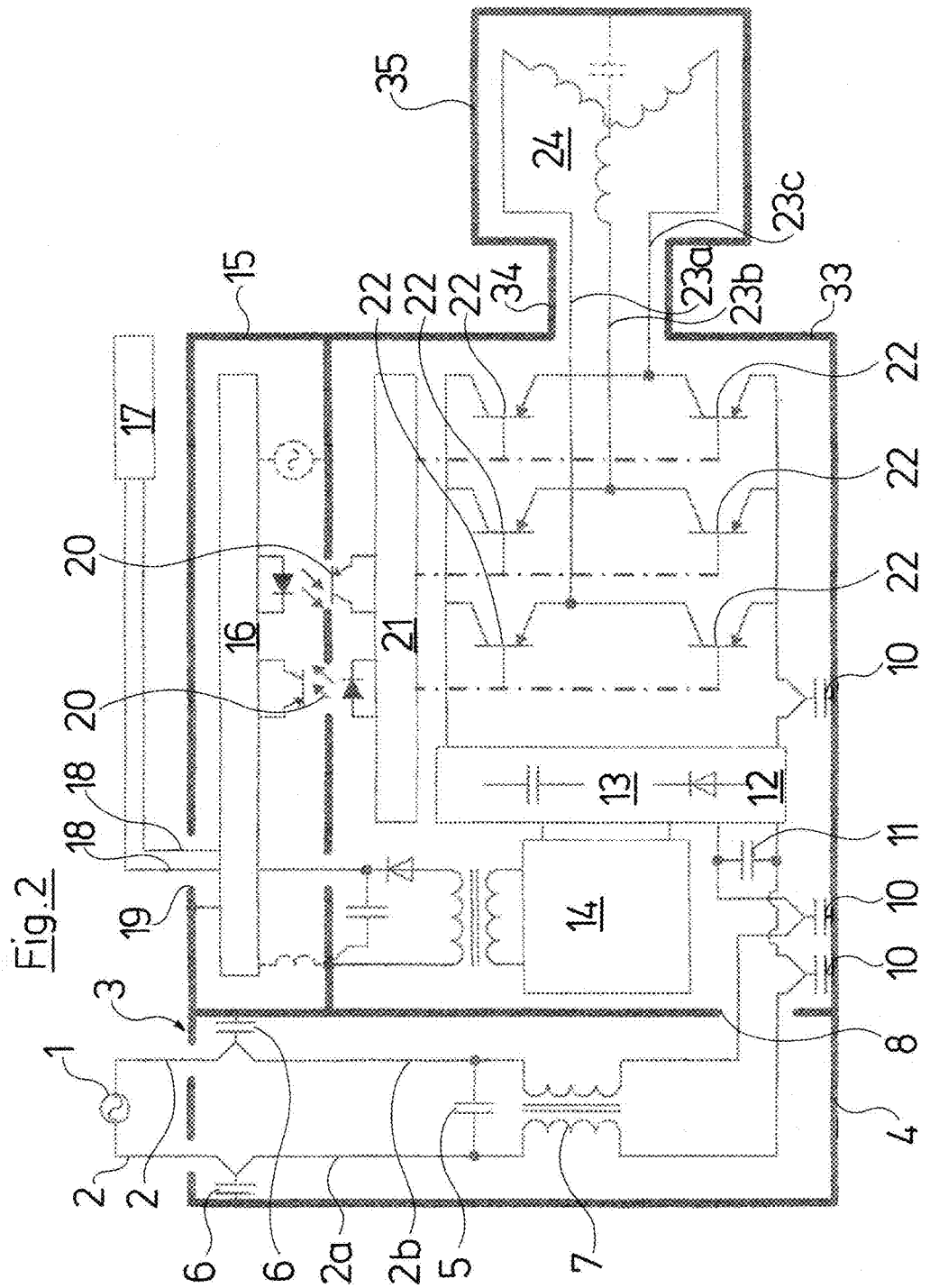
FIG. 2 is a circuit diagram showing an alternative design in the representation according to FIG. 1, where the motor and the inverter enclosure is built together in one unit.

With the embodiment variant represented by way of FIG. 2, which inasmuch as it concerns the first and third Faraday cage 4 and 15, corresponds identically to the previously described embodiment, the third Faraday cage which is characterized at 33 in FIG. 2 yet encompasses the motor 24 as well as the lead guidance (cable routing) to the motor. Thereby, the guiding of the leads is formed by a common lead screen or shielding 34 which on the one hand is connected to the third Faraday cage 33 and connects to this, as well as on the other hand connects onto a stator housing 35 which shields the stator of the motor 24 and thus forms part of the third Faraday cage 33. As the circuit diagram according to FIG. 2 illustrates, such an arrangement permits the omission of the chokes 25 and 30 as well as the capacitors 27 and 32 according to the embodiment according to FIG. 1, thus the output interference suppression filter can be done away with by way of this.

Figure 3A:
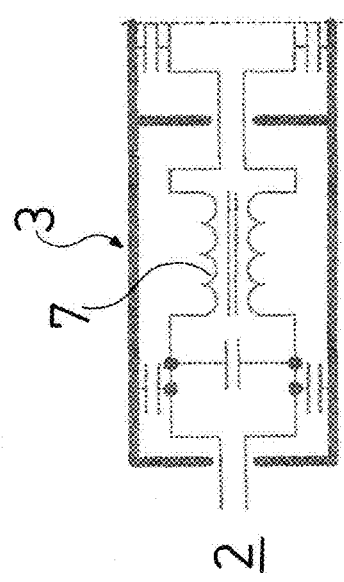
FIG. 3a is a circuit diagram of an input interference suppression filter of a first embodiment.
Figure 3B:
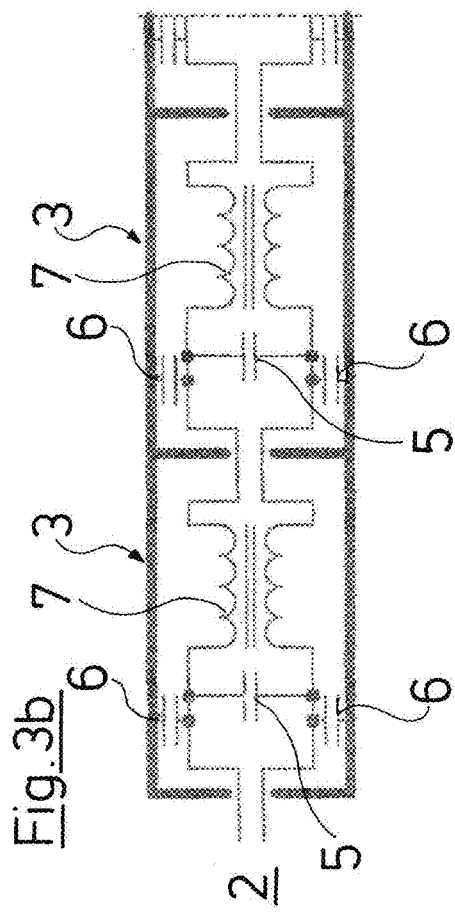
FIG. 3b is a circuit diagram of an input interference suppression filter according to a second embodiment.

Common to both embodiments is the fact that the power circuit is always arranged in a separate Faraday cage, since the power circuit in the complete frequency converter forms the greatest electromagnetic/electrostatic interference source. The particularly sensitive interface circuit which is arranged in the third Faraday cage 15 is arranged separately therefrom. Finally, the Faraday cage which forms the input interference suppression filter is likewise separated from the power circuit. As to how this filter is constructed in detail can also be deduced from FIG. 3a, below which a FIG. 3b is set opposite and which represents an embodiment which is improved even further with regard to this. With the embodiment according to FIG. 3b, two input interference suppression filters 3 are connected one after the other in series, by which means the electromagnetic compatibility of the frequency converter is even further improved.

The circuit pictures represented by way of FIGS. 1 to 3 essentially illustrate the electrical arrangement and circuiting of the components. It has been initially described as to how these are to be arranged on one or more circuit boards in different Faraday cages, and the variety of design has virtually no limits. It is particularly with the use of circuit boards constructed in a multi-layer manner that a conductive circuit board layer can advantageously form one or more Faraday cages. A Faraday cage can also run through a circuit board as has been described in detail by way of the FIGS. 4 to 6.

Figure 4:
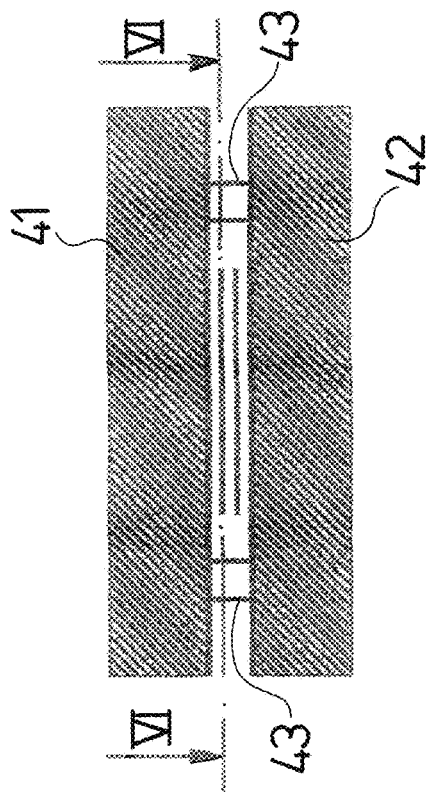
FIG. 4 is a sectional view of the connection of two Faraday cages through a multi-layer circuit board.
Figure 5:
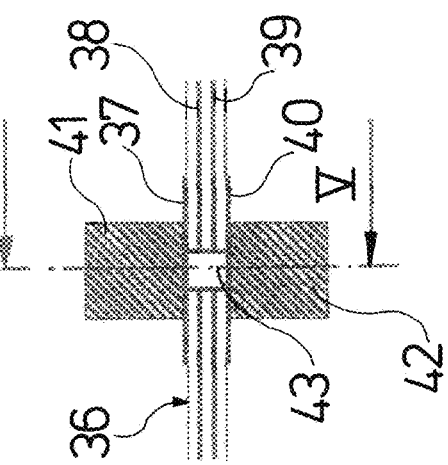
FIG. 5 is a sectional view along the section line V-V in FIG. 4.
Figure 6:
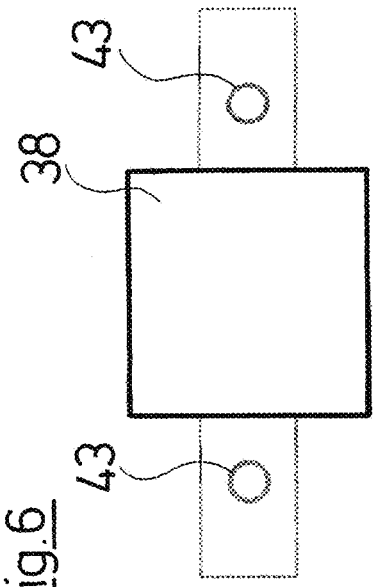
FIG. 6 is a sectional view along the section line VI-VI in FIG. 5.

The multi-layer circuit board 36 which is represented in the FIGS. 4 to 6 as a whole comprises four electrically conductive layers 37, 38, 39 and 40, which in each case per se can be used for circuiting electronic components which are arranged thereon or thereunder. If the electrically conductive layer 37 on the upper side or the electrically conductive layer 40 on the lower side form the strip conductors for the components arranged on the upper side or on the lower side in a manner known per se, then one or more Faraday cages which are closed off to the bottom by way of an electrically conductive layer 38 can be formed on the upper side, as well as Faraday cages which are closed off to the top by the conductive layer 39 arranged on the lower side can be formed.

It is represented by way of FIGS. 4 to 6 as to how a Faraday cage 41 provided on the upper side of the circuit board is electrically conductively connected through a circuit board to a Faraday cage 42 which is provided on the lower side of the circuit board in a manner aligned to said first mentioned Faraday cage, in order to thus form a common Faraday cage 41, 42 enclosing a section of the circuit board. The connection of the cages 41 and 42 is effected by way of wire holes 43 and peripheral strip conductors which depart from these, are arranged in the conductive layer 37 on the upper side or in the conductive layer 40 on the lower side, and at which the walls of the Faraday cages 41 and 42 are contacted. These wire holes 43 are provided at a certain distance to one another and are formed by a bore which passes through the circuit board 36 and in whose wall an electrically conductive layer is applied, said layer being connected to the electrically conductive layer 37 on the upper side, as well as to the electrically conductive layer 40 on the lower side of the circuit board in one region. The electrically conductive layers 38 and 39 which are arranged between the electrically conductive layers 37 and 40 on the upper side or lower side of the circuit board 36 are recessed in the region of these wire holes 43 and can thus be used for other electrical connections.

While specific embodiments of the invention have been shown and described in detail to illustrate the application of the principles of the invention, it will be understood that the invention may be embodied otherwise without departing from such principles.

The invention claimed is:

1. A power converter comprising a frequency inverter, comprising:
an enclosure; and
electronic components arranged in the enclosure, wherein the enclosure is at least partly constructed as a Faraday cage and there are at least two Faraday cages in the enclosure, wherein the electronic components comprise one or a plurality of components, which form an electromagnetic and/or electrostatic noise source during operation and are arranged in at least one Faraday cage of the at least two Faraday cages, and one or a plurality of components, which are susceptible to receiving electromagnetic and/or electrostatic noise signals, and are arranged in at least one other Faraday cage of the at least two Faraday cages.

2. A power converter comprising a frequency inverter, comprising:
an enclosure; and
electronic components arranged in the enclosure, wherein the enclosure is at least partly constructed as a Faraday cage and there are at least two Faraday cages in the enclosure, wherein at least the electronic switches of the power circuit of the power converter are arranged in the one Faraday cage.

3. A power converter comprising a frequency inverter, comprising:
an enclosure; and
electronic components arranged in the enclosure, wherein the enclosure is at least partly constructed as a Faraday cage and there are at least two Faraday cages in the enclosure, wherein the electronic components comprise at least one or a plurality of input and/or output noise filters arranged in separate Faraday cages of the at least two Faraday cages.

4. A power converter comprising a frequency inverter, comprising:
an enclosure;
electronic components arranged in the enclosure, wherein the enclosure is at least partly constructed as a Faraday cage and there are at least two Faraday cages in the enclosure; and
a feed-through-capacitor in a wall between two the at least two Faraday cages for conducting electric signals and/or electric power from one cage to another cage.

5. A power converter comprising a frequency inverter, comprising:
an enclosure;
electronic components arranged in the enclosure, wherein the enclosure is at least partly constructed as a Faraday cage and there are at least two Faraday cages in the enclosure; and
at least one capacitor electrically connected with one end to the wall of the Faraday cage, of the at least two Faraday cages, near a feed through hole and at another end connected to a conductor passing from one Faraday cage to another Faraday cage, of the at least two Faraday cages, through this feed through hole.

6. The power converter according to claim 5, wherein the at least one capacitor is electrically connected to the conductor and the wall of that Faraday cage in which a noisy signal occurs or is led to.

7. A power converter comprising a frequency inverter, comprising:
an enclosure; and
electronic components arranged in the enclosure, wherein the enclosure is at least partly constructed as a Faraday cage and there are at least two Faraday cages in the enclosure, wherein there is a separated Faraday cage, of the at least two Faraday cages, which defines an output filter cage of the power converter, comprising two or more power conductors leading to a motor with at least one capacitor operating between a conductor and the wall of the output filter cage.

8. The power converter according to claim 7, wherein in addition to electrical power conductors, only an input noise filter is arranged in one of the Faraday cages.

9. The power converter according to claim 8, wherein the electric motor, the power conductors between the power converter and electric motor and the power circuit of the power converter are enclosed by a common Faraday cage, of the at least two Faraday cages.

10. The power converter according to claim 9, wherein the common Faraday cage is formed by the metallic motor enclosure or a shielding of the motor, a cable duct and the Faraday cage of the construction of the power converter enclosure.

11. A power converter comprising a frequency inverter, comprising:
an enclosure; and
electronic components arranged in the enclosure, wherein the enclosure is at least partly constructed as a Faraday cage and there are at least two Faraday cages in the enclosure, wherein the Faraday cages are electrically connected to one another and to ground potential.

12. A power converter comprising a frequency inverter, comprising:
an enclosure; and
electronic components arranged in the enclosure, wherein the enclosure is at least partly constructed as a Faraday cage and there are at least two Faraday cages in the enclosure, wherein the power converter enclosure has three Faraday cages, of the at least two Faraday cages, one for at least the power circuit, another for an input noise-suppression filter and a further one for an interface circuit of the power converter.

13. A power converter comprising a frequency inverter, comprising:
an enclosure;
electronic components arranged in the enclosure, wherein the enclosure is at least partly constructed as a Faraday cage and there are at least two Faraday cages in the enclosure and
a circuit board with the electronic components arranged on the board and connected by traces on the top of the board, wherein at least some of the electronic components are enclosed by at least one Faraday cage, of the at least two Faraday cages, and one conducting layer of the board forms a wall of the Faraday cage.

14. The power converter according to claim 13, wherein the electronic components are arranged in separated areas of the circuit board, one or more separated areas are enclosed by one or more Faraday cages, of the at least two Faraday cages, and one conducting layer of the board forms a wall of the Faraday cages.

15. The power converter according claim 13, wherein the electronic components are arranged on the bottom and the top side of the circuit board which is a multilayer board with Faraday cages, of the at least two Faraday cages, on both sides of the board and a conducting layer inside the board which forms a wall of the Faraday cages on both sides.

16. A power converter comprising a frequency inverter, comprising:
an enclosure; and
electronic components arranged in the enclosure, wherein the enclosure is at least partly constructed as a Faraday cage and there are at least two Faraday cages in the enclosure, wherein there is a circuit board with electronic components on both sides of the board enclosed by a Faraday cage, of the at least two Faraday cages, the cage walls being on the top and on the bottom of the circuit board electrically connected to one another by wire holes leading through the circuit board.

17. A power converter comprising a frequency inverter, comprising:
an enclosure; and
electronic components arranged in the enclosure, wherein the enclosure is at least partly constructed as a Faraday cage and there are at least two Faraday cages in the enclosure, wherein the frequency inverter is for an electrical drive motor of a centrifugal pump and the power inverter enclosure is arranged on or on top of the motor and/or pump enclosure.

18. A power converter comprising a frequency inverter, comprising:
an enclosure; and
electronic components arranged in the enclosure, wherein the enclosure is at least partly constructed as a Faraday cage and there are at least two Faraday cages in the enclosure, wherein the Faraday cage is configured closed such that openings, free spaces, recesses have a clear width of maximal 3.3 mm.

19. A power converter comprising a frequency inverter, comprising:
an enclosure; and
electronic components arranged in the enclosure, wherein the enclosure is at least partly constructed as a Faraday cage and there are at least two Faraday cages in the enclosure, wherein the distance between electrical and/or electronic components to the wall of the Faraday cage, with the exception of the regions, in which leads are led through, is always greater than 10 mm.

* * * * *